(12) United States Patent
Wissen et al.

(10) Patent No.: US 10,497,684 B2
(45) Date of Patent: Dec. 3, 2019

(54) POWER SEMICONDUCTOR ARRANGEMENT HAVING A STACK OF CONNECTION PLATES

(71) Applicant: Infineon Technologies AG, Neubiberg (DE)

(72) Inventors: Matthias Wissen, Wadersloh (DE); Daniel Domes, Ruethen (DE); Andreas Groove, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/957,561

(22) Filed: Apr. 19, 2018

(65) Prior Publication Data

US 2018/0308827 A1    Oct. 25, 2018

(30) Foreign Application Priority Data

Apr. 20, 2017   (EP) ..................................... 17167264

(51) Int. Cl.

| | | |
|---|---|---|
| H01L 23/02 | (2006.01) | |
| H01L 25/10 | (2006.01) | |
| H01L 23/367 | (2006.01) | |
| H01L 23/52 | (2006.01) | |
| H01L 23/492 | (2006.01) | |
| H01L 25/11 | (2006.01) | |
| H01L 23/50 | (2006.01) | |

(52) U.S. Cl.
CPC ........ *H01L 25/105* (2013.01); *H01L 23/3675* (2013.01); *H01L 23/4922* (2013.01); *H01L 23/50* (2013.01); *H01L 23/52* (2013.01); *H01L 25/115* (2013.01); *H01L 25/117* (2013.01)

(58) Field of Classification Search
CPC .... H01L 25/105; H01L 25/115; H01L 25/117; H01L 23/3675; H01L 23/4922; H01L 23/50; H01L 23/52
USPC .......................................................... 257/685
See application file for complete search history.

(56) References Cited

U.S. PATENT DOCUMENTS

| | | | | |
|---|---|---|---|---|
| 2009/0085219 A1* | 4/2009 | Bayerer | ................... | H01L 24/48 257/776 |
| 2014/0343778 A1* | 11/2014 | Nishikawa | .............. | B60L 1/003 701/22 |

FOREIGN PATENT DOCUMENTS

| | | |
|---|---|---|
| DE | 102008049193 A1 | 1/2011 |
| DE | 102015101086 A1 | 4/2015 |

(Continued)

*Primary Examiner* — Calvin Y Choi
(74) *Attorney, Agent, or Firm* — Murphy, Bilak & Homiller, PLLC

(57) ABSTRACT

A power semiconductor arrangement includes a plurality of half-bridges arranged in parallel alongside one another by way of a longer longitudinal side of the half-bridges. An input load current terminal, an output load current terminal and a phase terminal are arranged on a top side of each of the half-bridges, the input load current terminals and the output load current terminals being arranged on an imaginary line that runs orthogonal to the longer longitudinal side of the half-bridges. First connection plates are connected to respective ones of the output load current terminals, and second connection plates are connected to respective ones of the input load current terminals. The first connection plates are arranged above the second connection plates. The first and the second connection plates are arranged in parallel with one another and electrically insulated from one another.

20 Claims, 4 Drawing Sheets

(56) References Cited

FOREIGN PATENT DOCUMENTS

DE 102015109814 A1 12/2015
EP 2028692 A1 2/2009

* cited by examiner

POWER SEMICONDUCTOR ARRANGEMENT HAVING A STACK OF CONNECTION PLATES

PRIORITY CLAIM

This application claims priority to European Patent Application No. 17167264.5 filed on 20 Apr. 2017, the content of said application incorporated herein by reference in its entirety.

TECHNICAL FIELD

The present invention relates to the field of power electronics, and particularly to a power semiconductor arrangement which has a plurality of similar, preferably identically designed, power semiconductor switching elements, which are arranged in a row and which are to be interconnected in parallel, one load current terminal for the load current input and one load current terminal for the load current output being provided for each switching element.

BACKGROUND

Power transistors, in particular insulated-gate bipolar transistors (IGBTs) are often used in energy, forming and transmission technology for the purpose of fast and low-loss switching of currents. To be able to switch high currents (in particular in the order of magnitude of 1 kA and above), a multiplicity of individual power semiconductor components, also referred to in the following text as power transistors, are electrically connected in parallel here. In this case, the power transistors are often combined in modules, which, among other things, makes simplified handling during installation and replacement possible, permits defined and optimized cooling, satisfies a range of safety aspects, etc. Inside a module, component groups or submodules are in this case often formed from subsets of the multiplicity of power transistors.

In terms of the switching behavior of the power semiconductor arrangement, it is generally desirable for a current to be able to be switched on or off as rapidly as possible. Particularly in the case of voltage-controlled power transistors, in which a current can be switched between a first power electrode and a second power electrode by means of a control voltage applied between the first power electrode and a control electrode, this is made difficult by inductive effects, among other things. These inductive effects affect not only the control voltage and cause a deviation of the effective control voltage from the specified control voltage, but also affect the load current output and load current input.

For instance, an inductive influence furthermore takes place as a result of temporally varying currents through the rest of the power transistors on account of so-called mutual inductances. In current-carrying conductors, that is to say around the load current terminals as well, magnetic fields are also formed. The electrical current flowing in the terminals leads to the formation of a magnetic flux. The way in which these magnetic fields propagate in the space around the current-carrying conductors and how large the magnetic flux resulting therefrom is depends on the magnetic properties of the surroundings. In this case, not only the magnetic properties of the materials in the surroundings but also the presence of further magnetic fields, caused by other load current terminals, play a crucial role. By connecting at least two power semiconductor switching elements in parallel, the individual load-current-carrying paths are influenced magnetically in such a way that the inductances of said paths can differ greatly. This leads to an uneven current distribution, also referred to as an asymmetrical current distribution, in particular during the switching instant, with the result that the switching behavior of the entire power semiconductor arrangement is influenced thereby.

It has been found that it is possible to address the problem of current asymmetry by means of the manner in which power semiconductor switching elements are contact-connected, by virtue of the fact that the inductances can be "balanced" and the current asymmetry during switching of the power semiconductor switching elements can be largely eliminated, for example, by way of different geometric design of the connection tongues and/or by way of separate shieldings of one of more power semiconductor switching elements.

However, it has also been found that the so-called skin effect leads to an uneven current distribution, in particular, in the case of high-frequency current components during the switching process, since the high-frequency current components propagate close to surfaces and, in particular, close to edges. In the case of a plurality of power semiconductor switching elements contact-connected by means of a common connection plate per load current direction, this leads to outer power semiconductor switching elements having a higher resulting commutation inductance and inner power semiconductor switching elements having a lower resulting commutation inductance.

SUMMARY

Against this background, one object of the invention is to provide a power semiconductor arrangement having a plurality of preferably identically formed power semiconductor switching elements, which are arranged in a row and which are to be interconnected in parallel, the switching behavior of which is improved, in particular in which the switching behavior of the individual power semiconductor switching elements is better matched to one another. It should be noted that the features described individually in the claims can be combined with one another in any desired, technologically appropriate way and indicate further configurations of the invention. The description, in particular in conjunction with the figures, additionally characterizes and specifies the invention.

The invention relates to a power semiconductor arrangement, which has a plurality of similar power semiconductor switching elements, which are arranged in a row and which are to be interconnected in parallel. Each power semiconductor switching element has one load current terminal for each load current direction, that is to say one load current terminal for the load current input and one load current terminal for the opposite load current direction, namely the load current output. These terminals are also denoted as DC+ and DC− terminals. In accordance with the invention, further terminals, such as at least one phase terminal for an alternating current, can also be provided. In other words, in one configuration, the electrical energy input to each power semiconductor switching element via the aforementioned load current terminals is output via other terminals, for example with the current being converted. In accordance with the invention, the intention is also not to rule out a plurality of load current terminals of the same load current direction also being provided for each power semiconductor switching element. Taking an overall view of the power semiconductor arrangement, a plurality of load current terminals for each load current direction from load current input and load current output are therefore created. The term "similar" should be interpreted broadly and means, for example, corresponding in terms of physical design but not necessarily an identical switching behavior. The term "power semiconductor switching element" should likewise be interpreted broadly and may include one single or a plurality of semiconductor components for each switching element. The "power semiconductor switching element" is also referred to in the following text as a module, which is fastened to a heatsink, for example, by way of screw connections and is electrically contact-connected by way of screw connections by means of contact-connection devices.

Said power semiconductor switching elements may also be power semiconductor switching elements that are not housed. Said power semiconductor switching element is preferably in each case a housed power semiconductor switching element, that is to say a power semiconductor switching element having a module housing. The module housings are each made, for example, of a plastic, preferably a fiber-reinforced plastic, such as a glass-fiber-reinforced thermoplast. The power semiconductor switching element is in each case, for example, an IGBT (insulated-gate bipolar transistor) or in each case a MOSFET (metal-oxide-semiconductor field-effect transistor). A second—different or identical—number of diodes connected in antiparallel can also be provided, in particular as protective diodes (freewheeling, snubber or flyback diodes), in particular in power semiconductor switching elements designed as or for use in bridge or half-bridge circuits.

In accordance with the invention, the power semiconductor arrangement also has in each case a connection plate as part of the electrical contact-connection device for each load current direction for the purpose of electrical contact-connection and fastening of a plurality of, in particular all, the load current terminals of the same load current direction from load current input and load current output. One connection plate is therefore provided in each case: one for the load current input and one for the load current output. The connection plate is in each case made, for example, of a conductive material, such as a metal or a metal alloy. The connection plate is in each case preferably made of lasered or punched metal sheet, such as copper sheet.

The connection plates are arranged in a manner electrically insulated from one another. The connection plates are arranged, for example, in a manner spaced apart from one another by means of an air gap and/or an insulating layer made of a dielectric. The connection plates are also arranged in a manner stacked in a stacking direction. "Fastening" means fastening to the associated load current terminal, for example, by means of one or more screw-fastening means. The connection plate is understood to be that part of the contact-connection device that represents at least the section of the respective contact-connection device determined for the directly adjoining arrangement at the associated load current terminal. The contact-connection device preferably has one or more upstream conductors for each load current direction and the connection plate in each case represents the last piece of the "path" between said conductor and the relevant load current terminals and serves for distributing the current to or from the associated load current terminals.

Each of the connection plates extends in each case along a first extension direction from an in-feed edge to an end edge. The term "edge" should be interpreted broadly and is not intended to imply a compulsorily rectilinear profile of the respective edge; the profile is preferably rectilinear. Alternatively, the in-feed edge is also referred to as the in-feed side. In this case, the connection plate extends away in the first extension direction via the associated load current terminals, wherein said load current terminals are contacted for the purpose of fastening and electrical contact-connection by the respective connection plate. The connection plate preferably forms an in-feed edge, which is opposite to the end edge. Each connection plate also extends along a second extension direction, which is orthogonal to the first extension direction and parallel to the imaginary line, in each case between two longitudinal edges, which preferably run parallel to one another.

The in-feed side or in-feed edge is understood to be that side or edge by means of which the load current to be input to all associated load current terminals is input and by means of which the load current to be output from all associated load current terminals is output, respectively. Said in-feed side or in-feed edge is, for example, the side, in particular edge, of the connection plate that is formed for connecting to further conductors or electrical components, for example components of an intermediate circuit.

To improve the switching behavior, two measures, which can be applied in accordance with the invention alternatively but also in combined fashion, are proposed:

In accordance with a first measure, at least one of the connection plates, preferably both connection plates, is/are slotted several times by means of slots running between the adjacent load current terminals of the same load current direction such that the relevant connection plate respectively forms sections, which are defined by the slots and are associated in each case with a load current terminal, and adjacent sections are electrically conductively connected only on the in-feed side, preferably only at the in-feed edge. Due to the multiple slots, the current density of high-frequency switching current components in the edge region defined by the slots is increased on account of the skin effect. As a consequence, with respect to an embodiment without slots, the inductance asymmetry resulting from the embodiment without slots and the commutation inductance resulting therefrom can be reduced.

In accordance with a second measure, at least one of the connection plates is bent along the longitudinal edges in the direction of the other connection plate so as to form an angular section. This is understood to mean in each case a section at the longitudinal side of the relevant connection plate that spans the other connection plate, said section being arranged in a manner angled, preferably orthogonal, with respect to the two extension directions, and said section facing the adjacent connection plate without contacting said connection plate. The terminal edge of a connection plate defined by the bending is arranged, for example, in the plane defined by the other connection plate or the section produced by the bending preferably extends over the plane defined by the other connection plate. As a result, the high switching current densities caused by the skin effect are reduced, for example, by electromagnetic interaction at the protruding edges of different load current directions.

On account of the relative position of the outer edges of the connection plates of different load current directions that is changed through this measure, there is a reduction in the inductance asymmetry present in this design compared to a design of the connection plates as a stack composed of planar connection plates.

Both of the measures described above can be used individually or in combination.

In accordance with one configuration, the respective slotted connection plate is slotted continuously from the in-feed edge up to the opposite end edge. The electrical connection between the sections on the in-feed side is provided in each case by one or more separate conductor sections, for example. In this case, the sections are mechanically separated by the slots and, if appropriate, are arranged on a common carrier composed of electrically insulating material for the purpose of mechanical stabilization.

To simplify production, there is preferably provision for the slots to extend from the end edge in the direction of the in-feed edge up to a remaining connecting web, which is formed by the relevant connection plate, without reaching the in-feed edge in this way, with the result that the connection plate is in each case not slotted continuously. The connecting web is therefore formed from the material of the connection plate and, during the step of producing the connection plate, is introduced therein, for example by lasering or punching. The connecting web extends, for example, in each case in a manner adjoining and along the in-feed edge.

The slots of the first mentioned measure can run, for example, obliquely to the first and second extension direction. In accordance with a preferred configuration, the slot extends in each case parallel to the longitudinal edge. Even more preferably, the slots run parallel to one another and in each case along the geometric central line between most closely adjacent load current terminals of opposite load current directions.

There is preferably provision for the load current terminals to each be arranged more closely adjacent to the associated end edge than to the in-feed edge. For example, the line defined by the load current terminals runs parallel to the end edge. The spacing between the line and the end edge is, for example, in the range of 0.5 to 3.0 cm, preferably in the range of 1.0 to 2.5 cm.

The connection plates are preferably provided with slots that run parallel to one another. Even more preferably, the connection plates are provided with slots that run in the stacking direction in an aligned and congruent manner.

To achieve a particularly uniform current distribution, in accordance with a preferred configuration, the sections of the associated connection plate, which are defined in each case by the slots and associated in each case with a load current terminal, are designed in a congruent manner, preferably for both load current directions, that is to say in a coincident manner at least with respect to their dimensions in the direction of the first and second extension direction.

The slots preferably have a maximum clear spacing, that is to say a maximum slot width, along their profile, of less than 5.0 mm, such as 2.5 mm, even more preferably less than 1 mm. The clear spacing is preferably consistent over the profile of the slots. The slots of the connection plates may have a corresponding clear space. In one preferred configuration, the connection plates of different load current directions may have a different clear spacing, wherein the slots associated with the respective connection plate have the same clear spacing. For example, the connection plate arranged closer to the power semiconductor switching elements has slots with a greater clear spacing than the slots associated with the connection plate spaced further apart from the switching elements.

The slots preferably have a length of more than 2.5 cm to 10.0 cm, preferably more than 3.5 cm to 8.0 cm.

The connecting web preferably has in each case a width defined by the length of the slots of less than 1.5 cm, preferably less than 1.0 cm.

In accordance with a preferred configuration having a combination of the first and second measure, the slots define associated slot edges, and one of the connection plates is bent along the slot edges in the direction of the other connection plate so as to form said angular section. Said slot edges extend, for example, through the slot of the respective other connection plate, said slot being most closely adjacent in the stacking direction, that is to say the connection plate provided for the opposite current direction.

One of the connection plates preferably has a plurality of apertures, which are each provided for feeding through the load current terminal and/or for access to one of the load current terminals of the other connection plate. Here, the aperture defines in each case a closed circumferential aperture edge and is preferably arranged offset to the edges, such as the longitudinal edges, in-feed edge, end edge and slot edges of the respective connection plate. The profile of the aperture edge is, for example, oval, circular, substantially rectangular. A rectangular profile with rounded corners is understood as substantially rectangular. Due to the offsetting of the aperture from the edges of the connection plate, the aperture is differentiated from a lateral recess of the connection plate and thus does not adversely affect the current distribution of high-frequency current components along the edges of the connection plate that is intended in accordance with the teaching of the invention.

The module housings of the power semiconductor arrangement are preferably of identical design. The connection plates are preferably designed in a manner overlapping the module housings.

In accordance with a preferred configuration, the module housings have long and short flanks, which are arranged in such a way that, except for one flank of the outermost module housing, in each case one long flank of a module housing is arranged most closely adjacent, for example adjoining, to a flank of another module housing.

In accordance with a preferred configuration, the connection plates are arranged in such a way that they bridge a cooling device, for example a liquid cooling device, that surrounds all the module housings of the power semiconductor arrangement. The in-feed edge is located, for example, outside of the outer circumference defined by the cooling device.

The invention further relates to the use of the power semiconductor arrangement in one of the embodiments described above as a converter. Converters are understood to be static electrical appliances or installations—that is to say without moving parts, but not necessarily stationary—for converting an in-fed electrical current type (direct current, alternating current) to the respective other type, or for modifying characteristic parameters such as the voltage and the frequency. Said converter is preferably used as an inverter, for example as an intermediate current circuit inverter, even more preferably as an intermediate voltage circuit inverter.

Those skilled in the art will recognize additional features and advantages upon reading the following detailed description, and upon viewing the accompanying drawings.

BRIEF DESCRIPTION OF THE DRAWINGS

These and other objects, advantages and features of the invention will become clear from the following detailed description of preferred exemplary embodiments of the invention in connection with the drawings.

DETAILED DESCRIPTION

Figure 1:
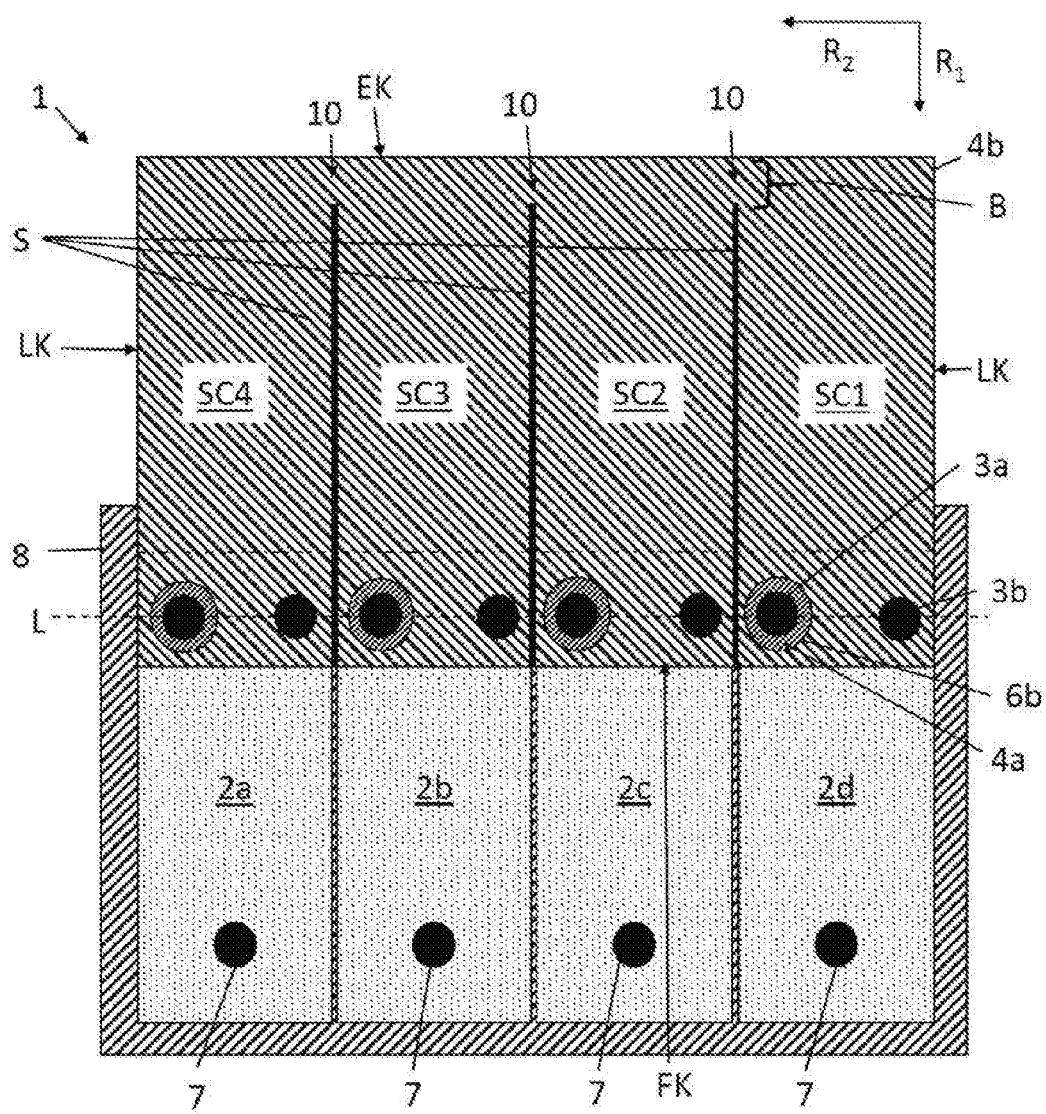
FIG. 1 shows a top view of a first embodiment according to the invention of the power semiconductor arrangement.
Figure 2:
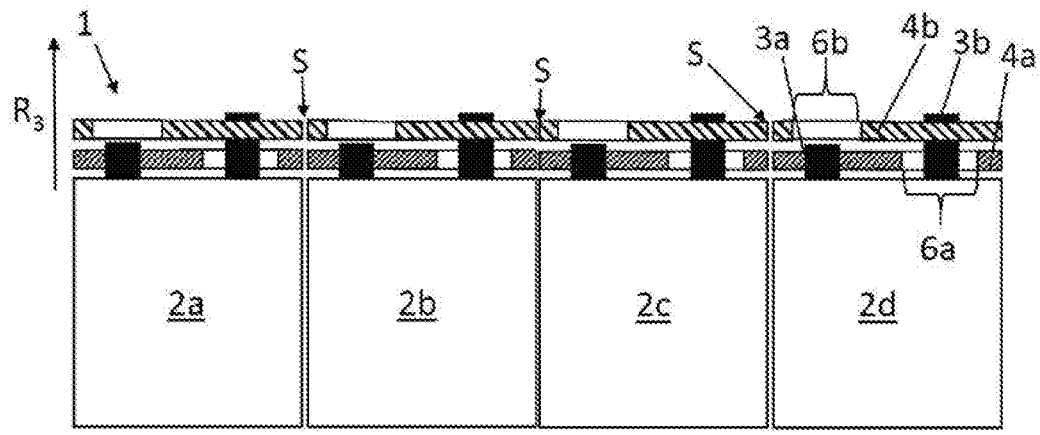
FIG. 2 shows a vertical sectional view through the embodiment according to the invention from FIG. 1.

FIG. 1 shows a top view of a first power semiconductor arrangement 1 according to the invention. For the purpose of further explanation, the associated sectional view of FIG. 2 is added as a section along the line L from FIG. 1. In the following text, unless specified otherwise, reference is made to both figures. The power semiconductor arrangement comprises a plurality of identically designed half-bridges 2a, 2b, 2c, 2d housed in an associated module housing, said half-bridges being arranged in parallel alongside one another by way of their longer longitudinal sides. The top sides of said half-bridges have load current terminals 3a for the load current input and load current terminals 3b for the load current output as well as phase terminals 7. All of the load current terminals 3a, 3b are arranged on an imaginary line L. Said terminals 3a and 3b are electrically connected to associated connection plates 4a and 4b by way of screwing, that is to say the load terminals 3b provided for the load current output are connected to the associated connection plate 4b, while the load current terminals 3a provided for the load current input are connected to the associated connection plate 4a, The connection plate 4b for the load current output is arranged above the connection plate 4a for the load current input.

Both are stacked above one another in the stacking direction $R_3$ and are arranged in parallel with one another and, on account of an air-gap spacing, electrically insulated from one another. As FIGS. 1 and 2 show, the connection plates 4a, 4b are of congruent design and therefore have corresponding outer dimensions. Said connection plates only partly overlap the module housings of the half-bridges 2a, 2b, 2c, 2d. In this case, said connection plates extend in each case along a first extension direction $R_1$ from an in-feed edge EK to the associated load current terminals 3a and 3b, respectively, in order to contact them, and further up to the end edge FK. In this case, the connection plate 4b is in contact with the associated load current terminals 3b and the connection plate 4a is in contact with the associated load current terminals 3a by way of cohesive connection and the load current terminals 3a and 3b, respectively, are each arranged closer to the end edge FK than to the in-feed edge EK. The in-feed edge EK does not necessarily have to have a rectilinear profile and is the edge of the connection plate 4a, 4b via which the entire load current is input or output. The current is, for example, input and output in each case by means of a capacitor (not illustrated in any more detail) connected in parallel upstream of the half-bridges 2a, 2b, 2c, 2d using its terminals.

The connection plates 4a, 4b extend along a second extension direction orthogonal to the first between the parallel longitudinal edges LK, which are located at the level of the longitudinal flanks of the outer module housings of the arrangement 1. The connection plates 4a and 4b in each case bridge a cooling device 8, which is arranged adjacent to the bottom side of the modules 2a, 2b, 2c, 2d and laterally protrudes beyond the outer circumference thereof. Both connection plates 4a, 4b are "segmented" into congruent sections SC1, SC2, SC3, SC4 by slots S except for the respective connecting web 10 remaining between the respective slot S and the in-feed edge EK of the connection plate 4a, 4b. In this case, the remaining connecting web 10 forms the element that connects the sections SC1, SC2, SC3, SC4 at the in-feed edge EK, which is arranged on the side of the respective connecting plate 4a and 4b, respectively, that defines the so-called in-feed side.

The slots S in both connection plates 4a, 4b are configured in a congruent and arranged in an aligned manner. Said slots extend in each case along the geometric central line between most closely adjacent, opposite current terminals from the end edge FK in the direction of the in-feed edge EK up to the connecting web 10, without completely pervading the connection plate 4a, 4b in this way. A load terminal of the associated load current direction, in the case of the connection plate 4b a load terminal 3b, is provided in each section SC1, SC2, SC3, SC4, wherein, for feeding-through through the upper connection plate 4b and for access through the upper connection plate 4b to the load terminal 3a of the lower connection plate 4a, said connection plates each have a circular aperture 6a and 6b, respectively, which are each arranged spaced apart from all the edges, the end edge FK, the in-feed edge EK and from the slot edges defined by the slots S. The spacing of the aperture from the respective end edge is, for example, 0.5 to 1.0 cm.

Figure 3:
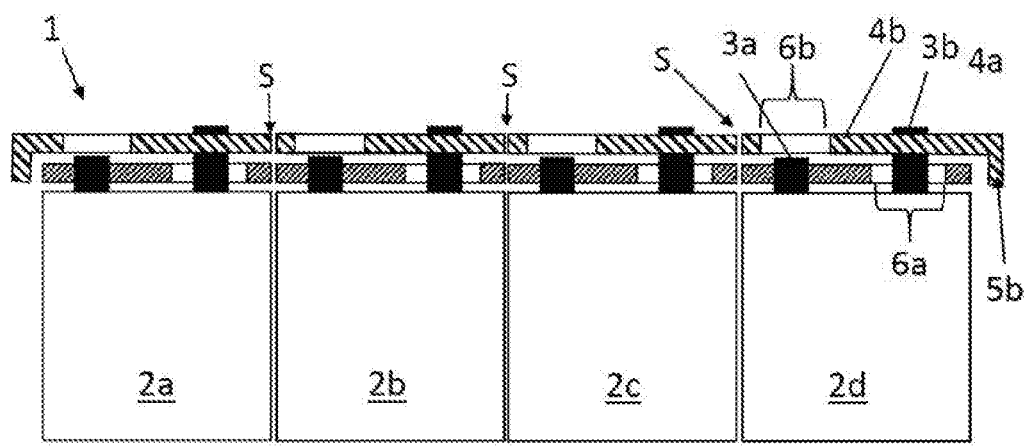
FIG. 3 shows a sectional view of a second embodiment according to the invention.

FIG. 3 shows a second embodiment of the power semiconductor arrangement 1 according to the invention. This embodiment differs from the embodiment shown in FIGS. 1 and 2 in that the connection plate 4b provided for the load current output is bent so as to form angular sections 5b along both longitudinal edges, said angular sections running orthogonally to the second extension direction. The angular sections 5b extend here over the connection plate 4a of the load current input without contacting it. The slots S provided above in relation to the first embodiment of FIGS. 1 and 2 are likewise provided accordingly.

Figure 4:
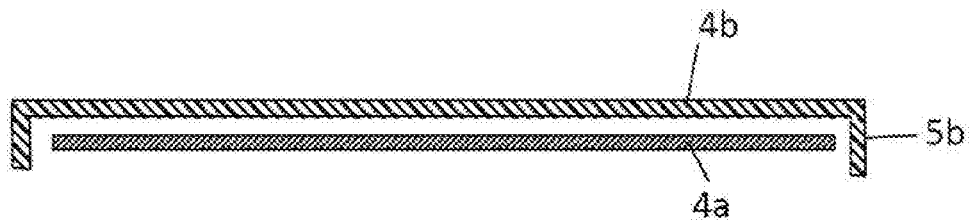
FIG. 4 shows a sectional view of the connection plates of a third embodiment according to the invention.

The third embodiment of the power semiconductor arrangement according to the invention explained on the basis of FIG. 4 is described only on the basis of the illustration of the connection plates 4a, 4b. The connection plates 4a and 4b are in turn provided for the electrical contact-connection of a plurality of half-bridges 2a, 2b, 2c, 2d, specifically, the connection plate 4a is provided for that of the load current terminals provided for the load current input and the connection plate 4b is provided for that of the load current terminals provided for the load current output. In the present embodiment, the formation of slots in the connection plates 4a, 4b has been omitted. However, provision is made here for the connection plate 4b provided for the load current output to be bent so as to form angular sections 5b along both longitudinal edges, said angular sections running orthogonally to the second extension direction. The angular sections 5b extend here over the connection plate 4a of the load current input without contacting it.

Figure 5:
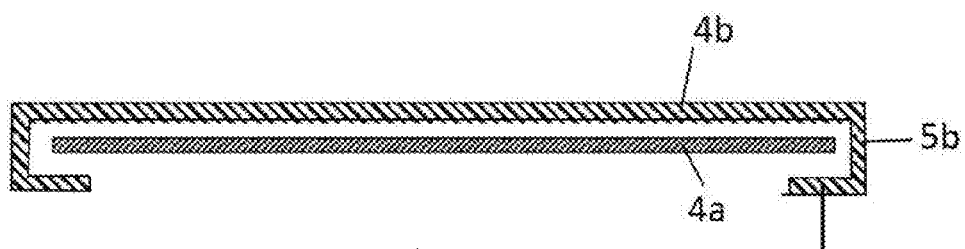
FIG. 5 shows a sectional view of the connection plates of a fourth embodiment according to the invention.

The fourth embodiment of the power semiconductor arrangement according to the invention provided in FIG. 5 is likewise described only on the basis of the illustration of the connection plates 4a, 4b. The connection plates 4a and 4b are in turn provided for the electrical contact-connection of a plurality of half-bridges 2a, 2b, 2c, 2d, specifically the connection plate 4a is provided for contact-connection of the load current terminals provided for the load current input and the connection plate 4b is provided for the contact-connection of the load current terminals provided for the load current output. In the fourth embodiment, the formation of slots in the connection plates 4a, 4b has been omitted. However, provision is made here for the connection plate 4b provided for the load current output to be bent so as to form angular sections 5b along both longitudinal edges, said angular sections running orthogonally to the second extension direction. The angular sections in this case encompass, with their sections 7b, the connection plate 4a, which is arranged below and provided for the load current input, without contacting said connection plate.

Figure 6:
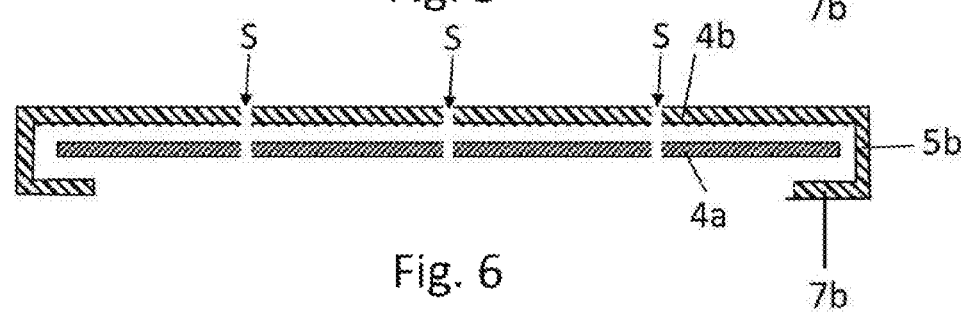
FIG. 6 shows a sectional view of the connection plates of a fifth embodiment according to the invention.

The fifth embodiment of the power semiconductor arrangement according to the invention shown in FIG. 6 is likewise described only on the basis of the illustration of the connection plates 4a, 4b. The connection plates 4a and 4b are in turn provided for the electrical contact-connection of a plurality of half-bridges 2a, 2b, 2c, 2d, specifically the connection plate 4a is provided for contact-connection of the load current terminals provided for the load current input and the connection plate 4b is provided for the contact-connection of the load current terminals provided for the load current output. Here, as in the fourth embodiment described above, provision is made for the connection plate 4b provided for the load current output to be bent so as to form angular sections 5b along both longitudinal edges, said angular sections running orthogonally to the second extension direction. The angular sections in this case encompass, with their sections 7b, the connection plate 4a, which is arranged below and provided for the load current input, without contacting said connection plate. In addition to this measure, the slots S known from the first embodiment are also provided in both connection plates 4a, 4b, which extend in parallel with the longitudinal edges from an in-feed edge up to a remaining connecting web. The slots S in both connection plates 4a and 4b are of congruent design and are arranged in an aligned manner.

Figure 7:
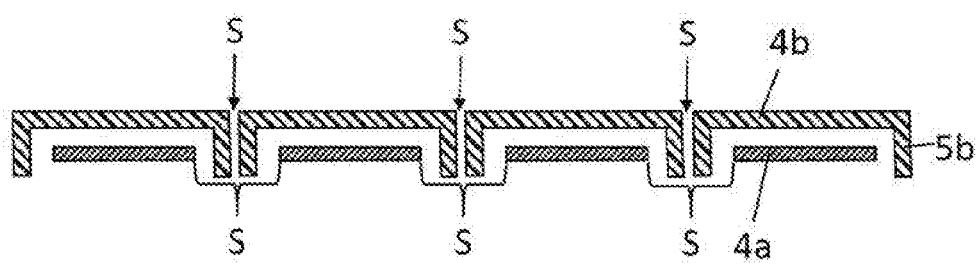
FIG. 7 shows a sectional view of the connection plates of a sixth embodiment according to the invention.

The sixth embodiment of the power semiconductor arrangement according to the invention illustrated by FIG. 7 is likewise described only on the basis of the illustration of the connection plates 4a, 4b. The connection plates 4a and 4b are in turn provided for the electrical contact-connection of a plurality of half-bridges 2a, 2b, 2c, 2d, specifically the connection plate 4a is provided for contact-connection of the load current terminals provided for the load current input and the connection plate 4b is provided for the contact-connection of the load current terminals provided for the load current output. The connection plates 4a and 4b in turn have slots S and S', respectively, for the segmentation of the connection plates 4a and 4b in certain areas. The slots S' of the connection plate 4a provided for the load current input have a larger width, that is to say clear spacing between the slot edges, than that of the slots S, which are inserted into the connection plate 4b provided for the load current output. Here, provision is made in turn for the connection plate 4b provided for the load current output to be bent so as to form angular sections 5b along both longitudinal edges, said angular sections running orthogonally to the second extension direction. Said angular sections that are produced by bending are also provided at the slot edges defining the slots and are therefore provided on both sides. The angular sections 5b in this case engage through the slots S' of the connection plate 4a arranged below.

Figure 8:
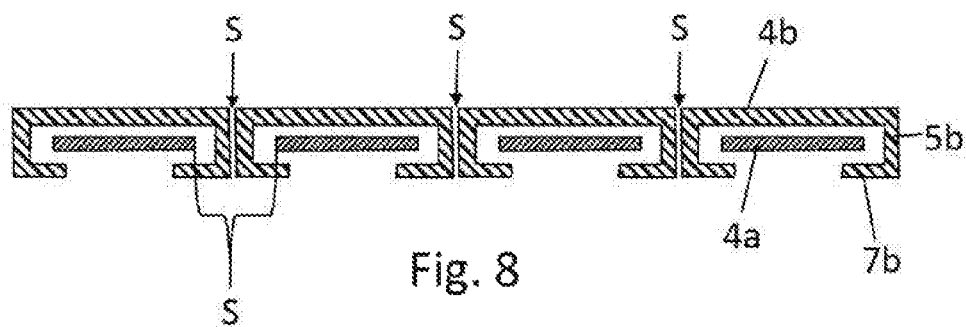
FIG. 8 shows a sectional view of the connection plates of a seventh embodiment according to the invention.

The seventh embodiment of the power semiconductor arrangement according to the invention shown in FIG. 8 is likewise described only on the basis of the illustration of the connection plates 4a, 4b. The connection plates 4a and 4b are in turn provided for the electrical contact-connection of a plurality of half-bridges 2a, 2b, 2c, 2d, specifically the connection plate 4a is provided for contact-connection of the load current terminals provided for the load current input and the connection plate 4b is provided for the contact-connection of the load current terminals provided for the load current output. The connection plates 4a and 4b in turn have slots S and S', respectively, for the segmentation of the connection plates 4a and 4b in certain areas. The slots S' of the connection plate 4a provided for the load current input have a larger gap width than that of the slots S, which are inserted into the connection plate 4b provided for the load current output. Here, provision is made in turn for the connection plate 4b provided for the load current output to be bent so as to form angular sections 5b along both longitudinal edges, said angular sections running orthogonally to the second extension direction. Said angular sections that are produced by bending are also provided at the slot edges defining the slots and are therefore provided on both sides. The angular sections 5b in this case engage through not only the slots S' of the connection plate 4a arranged below, but also encompass, with the sections 7, the connection plate 4a, which is arranged below and provided for the load current input, without contacting said connection plate.

Figure 9:
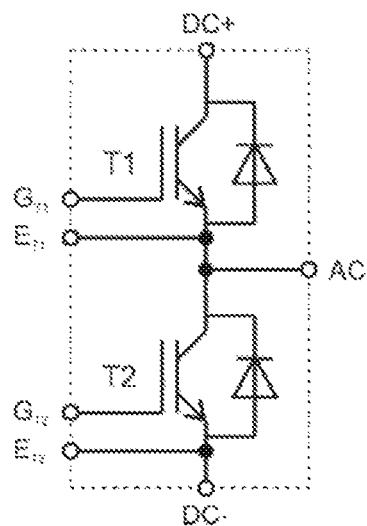
FIG. 9 shows an equivalent circuit diagram for a power semiconductor switching element designed as a half-bridge.

FIG. 9 shows an electronic circuit diagram for a half-bridge. Said half-bridge has two load current terminals DC+ and DC− on the one hand for the load current output and on the other hand for the load current input as well as a phase terminal AC. The half-bridge shown has two DC choppers each having an IGBT and diodes connected in antiparallel. The IGBTs T1 and T2 are actuated complementarily by means of the gate terminals $G_{T1}$ and $G_{T2}$: When T1 is conducting, T2 has to lock and vice versa, with the result that, depending on the switching state, an alternating current from the applied load currents DC+ and DC− is output at the phase terminal AC.

All of said measures to be taken from the embodiments described above individually or in combination ensure elimination or at least reduction of inductance asymmetry that results particularly in high-frequency switching processes in comparison to such embodiments in which the load terminals of a load current direction are contact-connected in each case by means of conventional connection plates spaced apart by means of an air gap. It is expressly pointed out once more that the bending of the upper connection plate 4b provided for the load current output shown in the figures can alternatively be provided at the lower connection plate 4a provided for the load current input.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A power semiconductor arrangement, comprising:
   a plurality of power semiconductor switching elements arranged in a row and interconnected in parallel, each power semiconductor switching element having one load current terminal for load current input and one load current terminal for load current output, each of the load current terminals of the same load current direction from load current input and load current output being arranged on a common imaginary line;
   a connection plate for each current load direction and configured to provide a joint electrical contact-connec- tion and fasten all the load current terminals of the same load current direction from load current input and load current output, the connection plates being arranged in a manner electrically insulated from one another, spaced apart from one another and stacked in a stacking direction, each connection plate extending away from an in-feed edge via the associated load current terminals and contacting the load current terminals to provide a contact-connection up to an end edge opposite the in-feed edge along a first extension direction and extending along a second extension direction which is orthogonal to the first extension direction and parallel to the imaginary line, between two longitudinal edges, wherein at least one of:
- the connection plates each comprise a plurality of slots running between the adjacent load current terminals of the same load current direction such that each connection plate forms sections which are defined by the slots and are associated in each case with a load current terminal, and adjacent sections are electrically conductively connected only at the in-feed edge; and
- at least one of the connection plates is bent along the longitudinal edges in a direction of the other connection plate so as to form an angular section.

2. The power semiconductor arrangement of claim 1, wherein the slots extend proceeding from the end edge in a direction of the in-feed edge up to a connecting web configured to electrically conductively connect the sections, the connecting web being formed by the connection plate.

3. The power semiconductor arrangement of claim 2, wherein the connecting web has a width of less than 1.5 cm.

4. The power semiconductor arrangement of claim 1, wherein the slots extend in each case parallel to one another and in each case along a geometric central line between directly adjacent load current terminals of opposite load current directions.

5. The power semiconductor arrangement of claim 1, wherein the load current terminals are each arranged more closely adjacent to the associated end edge than to the in-feed edge.

6. The power semiconductor arrangement of claim 1, wherein the connection plates are provided with the slots that run in the stacking direction in an aligned and congruent manner.

7. The power semiconductor arrangement of claim 1, wherein the sections of the respectively associated connection plate have a congruent design.

8. The power semiconductor arrangement of claim 1, wherein the slots have a maximum clear spacing along their profile of less than 5 mm.

9. The power semiconductor arrangement of claim 1, wherein the slots have a length of more than 2.5 cm to 10.0 cm.

10. The power semiconductor arrangement of claim 1, wherein the slots define associated slot edges and at least one of the connection plates is bent along the slot edges in a direction of the other connection plate so as to form angular sections.

11. The power semiconductor arrangement of claim 1, wherein the connection plates each comprise copper.

12. The power semiconductor arrangement of claim 1, wherein at least one of the connection plates has a plurality of apertures each configured to provide for feeding through and/or for access to one of the load current terminals, and wherein each aperture defines a closed circumferential aperture edge.

13. The power semiconductor arrangement of claim 1, wherein the power semiconductor switching elements each have a module housing.

14. The power semiconductor arrangement of claim 13, wherein the module housings of the power semiconductor arrangement are of identical design.

15. The power semiconductor arrangement of claim 13, wherein the connection plates are arranged so as to bridge a cooling device that surrounds all the module housings of the power semiconductor arrangement.

16. The power semiconductor arrangement of claim 13, wherein the module housings have long and short flanks which are arranged in such a way that, except for one flank of the outermost module housing, in each case one long flank of a module housing is arranged most closely adjacent to a flank of another module housing.

17. The power semiconductor arrangement of claim 16, wherein the slots extend proceeding from the end edge in a direction of the in-feed edge up to a connecting web configured to electrically conductively connect the sections, the connecting web being formed by the connection plate, and wherein the in-feed edge is arranged over the short flanks of the module housing and the connecting web is arranged in each case over the opposite short flanks of the module housing.

18. The power semiconductor arrangement of claim 1, wherein the power semiconductor switching elements are each formed as a half-bridge.

19. The power semiconductor arrangement of claim 1, wherein the power semiconductor arrangement is an intermediate voltage circuit inverter.

20. A power semiconductor arrangement, comprising:
- a plurality of half-bridges arranged in parallel alongside one another by way of a longer longitudinal side of the half-bridges;
- an input load current terminal, an output load current terminal and a phase terminal arranged on a top side of each of the half-bridges, the input load current terminals and the output load current terminals being arranged on an imaginary line that runs orthogonal to the longer longitudinal side of the half-bridges;
- first connection plates connected to respective ones of the output load current terminals via first joint electrical contact-connections; and
- second connection plates connected to respective ones of the input load current terminals via second joint electrical contact-connections,
- wherein the first connection plates are arranged above the second connection plates,
- wherein the first and the second connection plates are arranged in parallel with one another and electrically insulated from one another.

* * * * *